(12) United States Patent
Koike et al.

(10) Patent No.: US 6,979,612 B2
(45) Date of Patent: Dec. 27, 2005

(54) SEMICONDUCTOR DEVICES AND MANUFACTURING METHODS

(75) Inventors: Michio Koike, Sakata (JP); Yuji Oda, Nagano-ken (JP)

(73) Assignee: Seiko Epson Corp., Tokyo (JP)

( * ) Notice: Subject to any disclaimer, the term of this patent is extended or adjusted under 35 U.S.C. 154(b) by 0 days.

(21) Appl. No.: 10/760,022

(22) Filed: Jan. 19, 2004

(65) Prior Publication Data

US 2004/0145059 A1  Jul. 29, 2004

Related U.S. Application Data

(62) Division of application No. 09/178,875, filed on Oct. 26, 1998, now Pat. No. 6,696,733.

(30) Foreign Application Priority Data

Oct. 27, 1997  (JP) .................................... 9-294591
Sep. 8, 1998  (JP) ................................ 10-254417

(51) Int. Cl.[7] ................. H01L 21/8234; H01L 21/8244
(52) U.S. Cl. ....................... 438/238; 438/210; 438/239
(58) Field of Search ................................ 438/238, 239, 438/210; 257/379, 383, 529, 532, 535, E27.033, 257/E27.045, E29.139

(56) References Cited

U.S. PATENT DOCUMENTS 5,378,660 A * 1/1995 Ngan et al. .................. 438/656
5,698,463 A * 12/1997 Suga ........................... 438/253
6,107,105 A * 8/2000 Sandhu ........................... 438/3
6,211,078 B1 * 4/2001 Mathews ..................... 438/669

* cited by examiner

Primary Examiner—Tom Thomas
Assistant Examiner—Edgardo Ortiz
(74) Attorney, Agent, or Firm—Konrad Raynes & Victor, LLP; Alan S. Raynes

(57) ABSTRACT

A semiconductor device in certain embodiments includes an insulating layer provided above the upper surface of a semiconductor substrate, and a capacitive element section and a resistance element section formed above the insulating layer. In the capacitive element section, a gate electrode serving as an opposite electrode for the capacitive element is formed above the insulating layer. The gate electrode is covered with a dielectric layer comprising silicon oxide, silicon nitride or tantalum oxide, and an electrode for the capacitive element comprising $MoSi_x$ is provided above the dielectric layer. The resistance element section has a resistance element comprising $MoSi_x$ formed simultaneously with the electrode for the capacitive element in the same process.

2 Claims, 11 Drawing Sheets

10: Semiconductor device
12: Semiconductor substrate
14: Insulating layer
16: Capacitive element section
18: Resistance element section
20: Gate electrode
22: Dielectric layer
24: Capacity electrode
26: Insulating film
30: Drawer electrode
32: Resistance element body
130: MOS transistor (1)

(2)

| 10: Semiconductor device | 22: Dielectric layer |
| 12: Semiconductor substrate | 24: Capacity electrode |
| 14: Insulating layer | 26: Insulating film |
| 16: Capacitive element section | 30: Drawer electrode |
| 18: Resistance element section | 32: Resistance element body |
| 20: Gate electrode | 130: MOS transistor |

Oxygen atomic weight in TiN film (at. %)

SEMICONDUCTOR DEVICES AND MANUFACTURING METHODS

This application is a Divisional of U.S. application Ser. No. 09/178,875, filed Oct. 26, 1998 now U.S. Pat. No. 6,696,733, which is hereby incorporated by reference in its entirety.

TECHNICAL FIELD

Embodiments of the present invention relate to semiconductor devices such as an integrated circuit having active and passive elements.

RELATED ART

In a conventional semiconductor device such as an integrated circuit, a diffusion layer or a polysilicon layer formed on a semiconductor substrate has been commonly used as an electrode for forming a capacitive element.

However, the aforementioned electrode comprising a diffusion layer or polysilicon layer forms an obstacle for high-speed operation of an integrated circuit because of a large resistance and a large parasitic capacity. The conventional electrode of a capacitive element is formed from a different material than that used for a resistance element or a fuse element, and is formed using a process different than that used for forming the resistance element or the fuse element. This results in complicated manufacturing steps for fabricating the semiconductor device and increased cost.

SUMMARY

It is an object of embodiments of the present invention to solve the aforementioned problems in the conventional art and to reduce the parasitic capacity of an electrode for a capacitive element.

Another object of the invention is to simplify the manufacturing process and reduce manufacturing costs.

These and other objects may be carried out in certain embodiments by providing a semiconductor device including a capacitive element having at least one electrode composed from material selected from the group including titanium nitride (TiN), titanium nitride containing oxygen atoms, and $MoSi_x$.

Embodiments may also include semiconductor devices having active and passive elements and including an electrode of a capacitive element being formed of a high melting point material. A resistance element and/or a fuse element within the semiconductor device may be formed from the same high-melting-point material such as, for example, titanium nitride, titanium nitride containing oxygen atoms, and molybdenum silicide.

Embodiments may also include methods for manufacturing semiconductor devices. One embodiment includes forming a capacitive element above a substrate and forming a layer of material adjacent to the capacitive element. The layer of material may be a material selected from the group including TiN, titanium nitride containing oxygen atoms, and $MoSi_x$. An electrode for the capacitive element is formed from the layer of material.

Another embodiment includes a manufacturing method including forming an insulating layer above a semiconductor substrate and forming a conducting region above said insulating layer that is a gate electrode or an undercoat wiring. A dielectric layer is formed above the conducting region and a film is formed above the dielectric layer. The film is made from a material selected from the group including TiN, titanium nitride containing oxygen atoms, and $MoSi_x$. An electrode for a capacitive element is then formed above said dielectric layer by processing the film and an out-going electrode is formed in contact with the electrode for the capacitive element.

Yet another embodiment includes a manufacturing method including forming an insulating layer over a semiconductor substrate and forming a film selected from the group including of a TiN film, a titanium nitride film containing oxygen atoms, and an $MoSi_x$ film above said insulating layer. An electrode for a capacitive element is formed by processing the film and a dielectric layer is formed over the electrode. A second electrode is then formed over the dielectric layer.

Still another embodiment includes a manufacturing method including forming a diffusion layer in a semiconductor substrate and forming an insulating layer over the diffusion layer. A first through-hole is formed in the insulating layer located above the diffusion layer. A film selected from the group including a TiN film, a titanium nitride film containing oxygen atoms, and an $MoSi_x$ film is formed above the insulating layer and in the through-hole. An electrode for a capacitive element connected to the diffusion layer through said first through-hole by processing the film. A dielectric layer is formed above the electrode for the capacitive element and a second electrode for the capacitive element is formed above the dielectric layer. A second through-hole passing through the dielectric layer is formed above the diffusion layer and an out-going electrode connected to the diffusion layer is formed through the second through-hole.

Additional embodiments relate to methods for forming semiconductor devices including steps relating to the formation of a titanium nitride film containing oxygen atoms, as well as methods for forming elements such as resistance elements and fuse elements from the same layer of material that an electrode for a capacitive element is formed from.

BRIEF DESCRIPTION OF THE DRAWINGS

Embodiments of the invention are described with reference to the accompanying drawings which, for illustrative purposes, are schematic and not drawn to scale.

DESCRIPTION OF EMBODIMENTS

Figure 1:
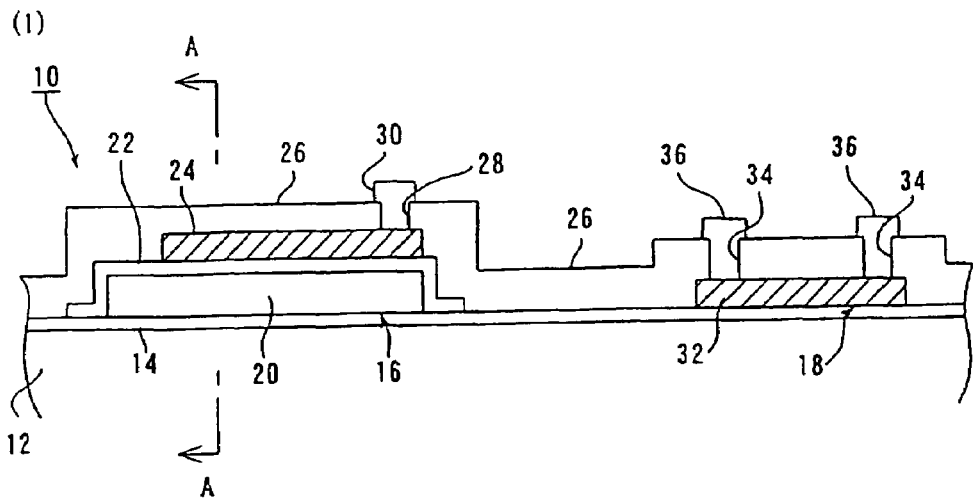
FIG. 1 shows partial sectional views of a semiconductor device according to a first embodiment of the present invention in which: (1) is a sectional view along the longitudinal direction of a gate electrode of an MOS transistor; and (2) is a sectional view of (1) cut along the line A—A.
Figure 1:
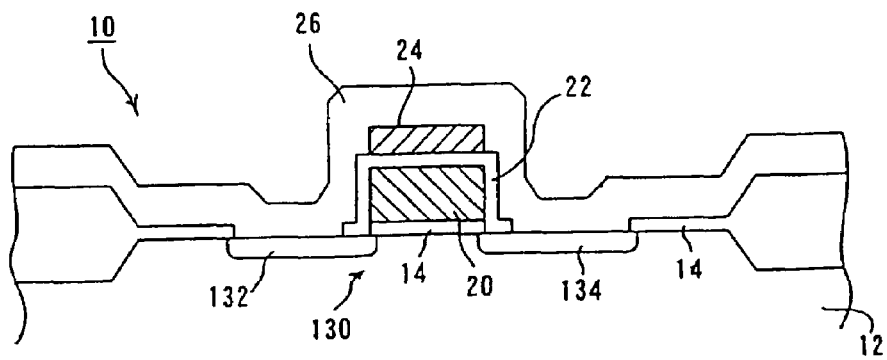

Embodiments of the present invention may include a semiconductor device having integrated active and passive elements on or in a semiconductor substrate. The device may include an electrode for a capacitive element that is fabricated from titanium nitride (TiN), titanium nitride containing oxygen atoms, or molybdenum silicide ($MoSi_x$). In such embodiments it is possible to reduce the parasitic capacity and thus to increase operating speed of a large integrated circuit. By forming the electrode of the capacitive element by TiN, titanium nitride containing oxygen atoms, or $MoSi_x$, it is possible to form the same in an arbitrary step, and to improve the degree of freedom of manufacture as compared with an electrode comprising a diffusion layer.

Semiconductor devices according to certain embodiments of the present invention may have a configuration in which any one of a resistance element, a fuse element and the electrode of the capacitive element comprise a high-melting-point metal compound. Applicable high-melting-point metal compounds include TiN, titanium nitride containing oxygen atoms and $MoSi_x$. Titanium nitride containing oxygen atoms should preferably have an oxygen atomic weight within a range of from 5 to 25 atomic %. $MoSi_x$ should preferably have a value of x within a range of from 1.7 to 3.3. The electrode comprising TiN, titanium nitride containing oxygen atoms, or $MoSi_x$ may be formed above a dielectric material forming a capacitive element, or below the same. Further, the other electrode of the capacitive element may comprise a gate electrode or an undercoat wiring. By forming the electrode for the capacitive element and the resistance element or the fuse element with the same material (for example, with $MoSi_x$ having the same value of x), it is possible to form the electrode for the capacitive element and the resistance element or the fuse element simultaneously in the same step, thus permitting simplification of the manufacturing steps and reduction of cost.

Embodiments of the present invention also relate to manufacturing methods including methods for forming a semiconductor device including integrated active and passive elements. In certain embodiments an insulating layer is formed above a semiconductor substrate and a gate electrode or an undercoat wiring is formed above the insulating layer. A dielectric layer is formed above the gate electrode or the undercoat wiring and a TiN film, titanium nitride film containing oxygen atoms, or an $MoSi_x$ film is formed over the dielectric layer to cover the entire surface of the substrate. The TiN, titanium nitride containing oxygen atoms or $MoSi_x$ film is processed to form an electrode for a capacitive element and an out-going electrode connected to the electrode for the capacitive element is then formed.

Embodiments also relate to a method including forming an insulating layer above a semiconductor substrate and forming a layer of TiN, titanium nitride containing oxygen atoms, or $MoSi_x$ on the substrate. A first electrode for a capacitive element is formed by processing the layer of TiN, titanium nitride containing oxygen atoms, or $MoSi_x$ film. A dielectric layer is formed above the electrode for the capacitive element and a second electrode for the capacitive element is formed above the dielectric layer. An out-going electrode connected to the first electrode for the capacitive element may also be formed.

In certain embodiments the insulating film provided above the semiconductor substrate can be used as the dielectric layer. By using the insulating film as the dielectric layer, it is not necessary to form a separate dielectric layer, thus simplifying the process.

The step of forming a dielectric layer may in certain embodiments also include forming an insulating film above the surface of a semiconductor substrate and removing the portion of the insulating film located above a gate electrode or an undercoat wiring. A dielectric film may then be formed so as to cover the portion of the insulating film that was removed. When the dielectric layer is provided separately, it is possible to form the dielectric layer of an arbitrary thickness and easily adjust the capacity of the capacitive element.

Embodiments may also include a method in which an insulating layer is formed above the semiconductor substrate and a layer of TiN, titanium nitride containing oxygen atoms, or $MoSi_x$ is formed above the entire surface of the insulating layer. An electrode for a capacitive element is formed by processing the layer of TiN, titanium nitride containing oxygen atoms, or $MoSi_x$, and a dielectric layer is formed above the electrode for the capacitive element. An opposite electrode for the capacitive element may be formed above the dielectric layer. The opposite electrode for the capacitive element may be formed simultaneously with an out-going electrode connected to the electrode for the capacitive element, thus permitting simplification of the process.

Certain embodiments may include semiconductor devices and methods of manufacturing semiconductor devices comprising active and passive elements inseparably connected on a semiconductor substrate or in the semiconductor substrate, in which an electrode for a capacity element comprises TiN or titanium nitride containing oxygen atoms, or $MoSi_x$.

Manufacturing methods for semiconductor devices including active and passive elements according to embodiments of the present invention may also include forming a diffusion layer in a semiconductor substrate and forming an insulating layer above the semiconductor substrate. A first through-hole is formed in the insulating layer located above the diffusion layer and a layer of TiN, titanium nitride containing oxygen atoms, or $MoSi_x$ is formed over the insulating layer and within the first through-hole. An electrode for a capacitive element connected to the diffusion layer via the first through-hole is formed by processing the layer of TiN, titanium nitride containing oxygen atoms, or $MoSi_x$. A dielectric layer may be formed above the electrode for the capacitive element and an opposite electrode for the capacitive element may be formed above the dielectric layer. A second through-hole passing through the insulating layer above the diffusion layer may be formed and an out-going electrode connected to the diffusion layer via the second through-hole extending above the insulating layer.

The titanium nitride film containing oxygen atoms can be formed in a variety of ways including forming a TiN layer by sputtering, and then (1) injecting oxygen ions into the TiN layer formed by sputtering, or (2) oxidizing the TiN film formed by sputtering. The titanium nitride layer containing oxygen may also be formed by sputtering with Ti as a target in an atmosphere comprising oxygen gas and nitrogen gas, or by forming a Ti layer by sputtering and then annealing in an atmosphere comprising oxygen gas and nitrogen gas. The $MoSi_x$ film can in certain embodiments be formed by sputtering with an $MoSi_x$ target having the same composition as that of the desired $MoSi_x$ film.

In certain preferred embodiments the electrode for the capacitive element should comprise a titanium nitride film containing oxygen atoms or an $MoSi_x$ film having the same composition as that of at least one of a resistance element and a fuse element. In addition, the electrode is preferably formed simultaneously with at least one of the resistance element and the fuse element.

In certain embodiments the electrode for the capacitive element comprising titanium nitride film containing oxygen atoms may be formed by sputtering a TiN film not containing oxygen onto the substrate, and injecting oxygen ions into, or oxidizing, the TiN film not containing oxygen atoms at a position where a resistance element or a fuse element is to be formed, so that a titanium nitride film containing oxygen atoms results. The titanium nitride film containing oxygen atoms may be formed simultaneously with at least any one of the resistance element or the fuse element, by simultaneously processing the TiN film not containing oxygen atoms and the titanium nitride film containing oxygen atoms.

Certain preferred embodiments of semiconductor devices and manufacturing methods will now be described in detail with reference to the attached drawings.

FIG. 1 shows partial sectional views of a semiconductor device of a first embodiment of the present invention: (1) is a sectional view along the longitudinal direction of a gate electrode of an MOS transistor; and (2) is a sectional view of (1) cut along the line A—A. In FIG. 1, a semiconductor device 10 has an insulating layer 14 serving as a gate oxide film comprising a silicon oxide film ($SiO_2$ film) formed on the upper surface of a semiconductor substrate 12 such as silicon. A capacitive element section 16 forming a capacitor which is a passive element, and a resistance element section 18 are provided above the insulating layer 14.

The capacitive element section 16 comprises a gate electrode 20 of an MOS transistor 130, serving as an active element comprising, for example, $MoSi_x$ formed on the insulating layer 14, a dielectric layer 22, for storing electric charge, comprising silicon oxide ($SiO_2$), silicon nitride ($Si_3N_4$) or tantalum ($Ta_2O_5$), provided so as to cover the gate electrode 20, and an electrode 24 for the capacitive element comprising $MoSi_x$ (molybdenum silicide), formed above the dielectric layer 22. The gate electrode is not limited to $MoSi_2$, but may comprise polysilicon introducing impurities or a combination of polysilicon and a high-melting-point metal. In the case of a polysilicon gate, it can be formed by depositing polysilicon into a thickness of from 200 to 500 nm by the CVD process, and diffusing phosphorus in a $POCl_3$ atmosphere. The gate electrode 20 serves as an opposite electrode on one side for the capacitive element, and the electrode 24 for the capacitive element opposes the gate electrode 20 via the dielectric layer 22. The upper portion of the capacitive element section 16 is covered with an insulating film 26 such as a silicon oxide film or a silicon nitride film provided above the semiconductor substrate 12. The insulating film 26 is not limited to $SiO_2$ or $SiN_x$, but may be any usual interlayer insulating film. It is not limited to a single-layer film but may be a multi-layer film. A through-hole (contact hole) 28 is formed at a prescribed position above the electrode 24 for the capacitive element in this insulating film 26. An out-going electrode 30 formed with a metallic wiring comprising a metal such as aluminum (Al), an aluminum-silicon-copper alloy (Al—Si—Cu alloy) or an aluminum-copper alloy (Al—Cu alloy), or a combination of a barrier metal such as TiN or TiW with aluminum or an aluminum alloy formed above the insulating film 26 is connected to the electrode 24 for the capacitive element via the through-hole 28.

On the other hand, the resistance element section 18 has a resistance element 32 formed above the insulating layer 14. The reference element 32, as described later in detail, may comprise $MoSi_x$ having the same composition as that of the electrode 24 for the capacitive element, and is formed simultaneously with the electrode 24 for the capacitive element. Through-holes 34 are provided at a position on the insulating film 26 covering the resistance element 32 corresponding to the both ends of the resistance element 32, and an out-going electrode 36 formed above the insulating film 26 is connected to the resistance element 32 via the through-hole 34. This out-going electrode 36 of the resistance element section 18 and the out-going electrode 30 of the capacitive element section 16 may be made of the same material and formed in the same step.

The MOS transistor 130 has a gate electrode 20 formed via the insulating layer (gate oxide film) 14 above the semiconductor substrate 12, as shown in FIG. 1(2). In the MOS transistor 130, the gate electrode 20 serves as an opposite electrode on one side for the capacitive element as described above, and a source 132 and drain 134 formed by diffusing impurities into the semiconductor substrate 12 are provided on the sides of the gate electrode 20.

The insulating layer 14 may comprise a silicon nitride film (SiN film) or the like, or may be an element separating film such as an LOCOS provided on the surface of the semiconductor substrate. Further, when an element is provided below the insulating layer 14, it may be a single-layer or multi-layer interlayer insulating film.

In the semiconductor device 10 formed as described above, in which the electrodes forming the capacitive element 16 comprise the gate electrode comprising $MoSi_2$ and the electrode 24 for the capacitive element comprising $MoSi_x$, it is possible to reduce the parasitic capacity, thus permitting high-speed operation of a large scale integrated circuit. In this embodiment, the electrode 24 for the capacitive element and the reference element 32 are made of $MoSi_x$ having the same composition, and are formed simultaneously in the same step. It is therefore possible to simplify the manufacturing process and reduce the cost. Unlike an electrode based on a diffusion layer, the electrode 24 for the capacitive element comprising $MoSi_x$ of this embodiment can be formed in an arbitrary step, thus permitting achievement of a higher degree of freedom of manufacture.

Taking account of forming the resistance element 32, the composition ratio of $MoSi_x$ forming the electrode 24 for the capacitive element should be such that the value of x is preferably within a range of from 1.7 to 3.3, or more preferably within a range of from 2.0 to 2.5. Molybdenum silicide having a value of x smaller than 1.7 is not generally suitable for a material for the resistance because of a small specific resistance. Molybdenum silicide having a value of x over 3.3 will generally have a low oxidation resistance and be poor in processability and ease of handling.

In this embodiment, the above description has covered the case with the electrode 24 for the capacitive element and the resistance element 32 formed of $MoSi_x$. The electrode 24 for the capacitive element may alternatively be made of TiN or titanium nitride containing oxygen atoms. While the description of the embodiment has covered the case where an electrode of the capacitive element 16 is a gate electrode 20, this electrode may alternatively be an undercoat wiring comprising Al, Al—Cu, Al—Si—Cu, or a combination of a barrier metal such as TiN or TiW with Al or an aluminum alloy. In the above description of the embodiment, simultaneous forming of the electrode 24 for the capacitive element and the resistance element 32 in the same step has been described, but they may also be separately formed.

When forming the resistance element 32 with titanium nitride containing oxygen atoms, the oxygen atom content should preferably be up to 25 atomic %. An oxygen atomic weight of larger than 25 atomic % results in formation of much titanium oxide (TiO) having a high vapor pressure, and a larger amount of sublimation of TiO in a heat treatment. This leads to a risk of variation of resistance value before and after the heat treatment.

Figure 2:
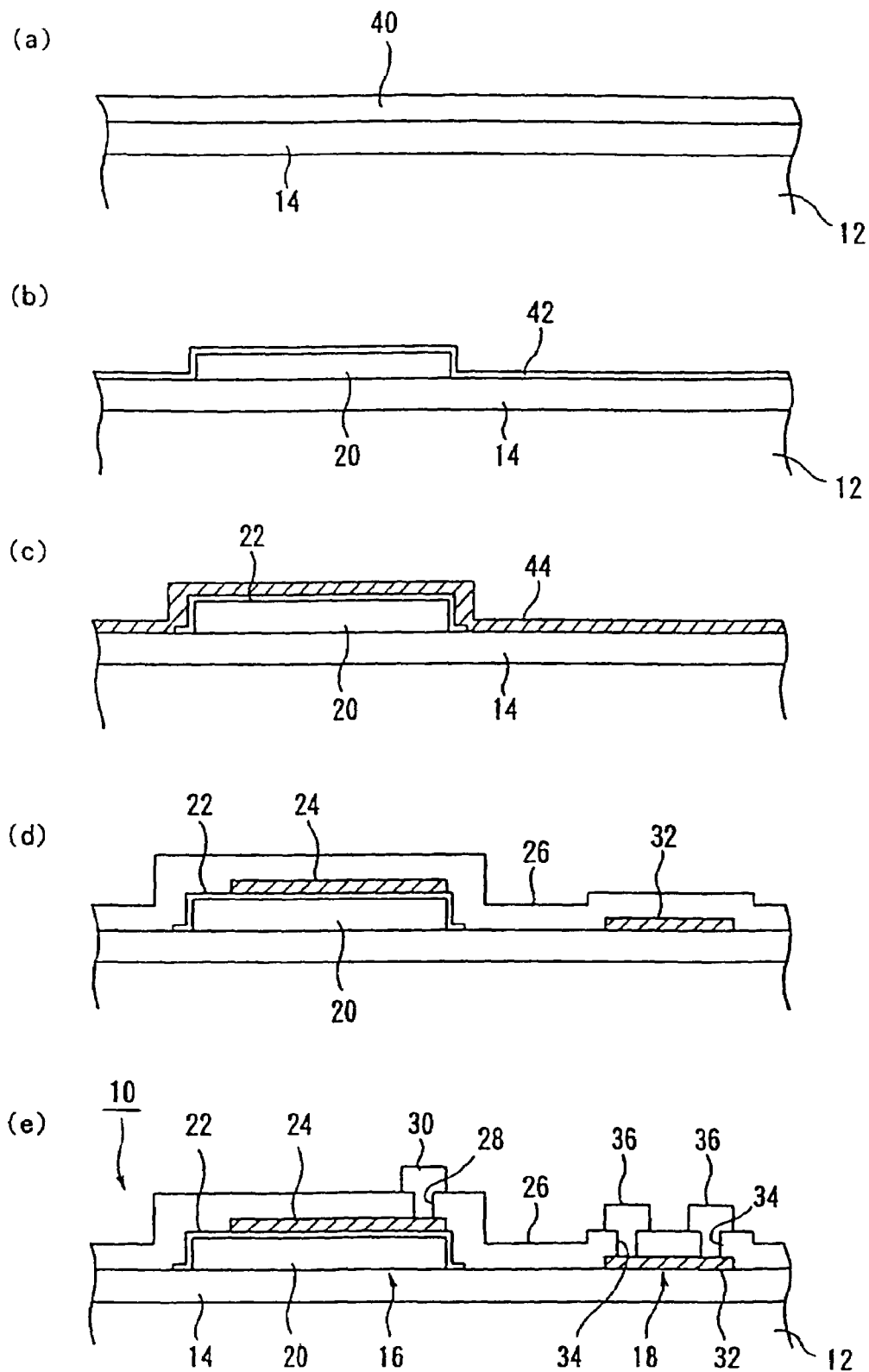
FIG. 2 is a process diagram illustrating a manufacturing method of a semiconductor device according to a second embodiment of the invention.

FIG. 2 illustrates a second embodiment of the invention and is a process diagram of the manufacturing method of the semiconductor device 10 shown in FIG. 1.

First, as shown in FIG. 2(a), an insulating layer 14 comprising a silicon oxide film or a silicon nitride film is formed on the upper surface of the semiconductor substrate 12 by the CVD process into a prescribed thickness (for example, 400 nm). Then, an $MoSi_2$ film 40 for forming a gate electrode is deposited into a thickness of from 200 to 300 nm. Then, after forming a photoresist film at a portion for the gate electrode, the $MoSi_2$ film 40 at the portion other than that for the gate electrode may be removed by dry etching to form the gate electrode 20 (FIG. 2(b)). Then, a dielectric film 42 comprising silicon oxide ($SiO_2$), silicon nitride ($Si_3N_4$), or tantalum oxide ($Ta_2O_5$) may be deposited by a CVD process or the like into a prescribed thickness (for example, 40 nm) over the entire surface of the semiconductor substrate 12 above the insulating layer 14. Then, a photoresist film is provided above the dielectric film 42 corresponding to the portion covering the gate electrode 20. The dielectric film 42 at the portion other than the gate electrode 20 and surroundings is removed by etching, and as shown in FIG. 2(c), a dielectric layer 22 covering the gate electrode 20 is formed. Then, an $MoSi_x$ film is formed into a thickness of preferably from 5 to 100 nm, to cover the entire surface of the semiconductor substrate 12 above the insulating layer 14. The $MoSi_x$ film 44 may be formed by DC magnetron sputtering with $MoSi_x$ having the same composition as that of the $MoSi_x$ film 44 as a target.

The composition ratio of Mo to Si is determined by considering the level of processability and ease of handling of the $MoSi_x$ film 44 and the specific resistance and size of the resistance element 32. The $MoSi_x$ film 44 should preferably have a thickness of from 5 to 100 nm, or more preferably, from 20 to 60 nm. This deposited film thickness is determined by taking into account the resistance value and the pattern size of the resistance element 32. With a thickness smaller than 5 nm, it is not only difficult to form a uniform film, but the film may be removed together with the insulating film while etching the insulating film, resulting in the undesirable formation of holes. In view of ease of processing, the thickness should preferably be at least 20 nm. A thickness of over 100 nm generally leads to a sheet resistivity of under 100 Ω/G, thus making the resistance unpracticable. Particularly with a thickness of under 60 nm, it is possible to easily form a resistance element having a desired resistance value.

In the example, molybdenum silicide having a composition ratio of Mo to Si of 1:2.3, i.e., having a value of x of 2.3 was used as a target, and an $MoSi_x$ film 44 was formed into a thickness of 40 nm by DC magnetron sputtering in an argon gas atmosphere of $8 \times 10^{-3}$ Torr. A power density of 2.8 W/cm$^2$ was used in sputtering, with a growing rate of the film of 400 nm/min. The formed $MoSi_x$ film 44 had a specific resistance of about 1 mΩ·cm and a sheet resistivity of about 240 Ω/G.

After thus forming the $MoSi_x$ film 44, the portion for forming an electrode for capacitive element opposite to the gate electrode 20 and the portion for forming a prescribed resistance element are covered with a photoresist by the photolithographic process. The $MoSi_x$ film 44 may be removed by dry etching from the portions other than the portion for forming the electrode for capacitive element and the portion for forming the resistance element, to form the electrode 24 for the capacitive element and the resistance element main body 32 (FIG. 2(d)).

Subsequently, an insulating film 26 comprising a silicon oxide film or the like is preferably formed into a thickness of from 200 to 400 nm above the entire surface of the semiconductor substrate 12 by the CVD process, and as shown in FIG. 2(e), a plurality of through-holes 28 and 34 are formed in the upper portion of the electrode 24 for the capacitive element and in the upper portion of a land portion of the resistance element 32 by etching. Then, a metallic film comprising Al, A—Cu, Al—Si—Cu, or a combination of a barrier metal such as TiN or TiW with Al or an aluminum alloy, is deposited by sputtering into a thickness of about 500 nm. After forming a photoresist film on a portion for wiring by the photolithographic process, the metallic film on portions other than the portion for wiring may be removed by the dry etching process using a Cl-based gas, or the wet etching process using an etchant mainly comprising phosphoric acid such as a mixed solution of phosphoric acid, nitric acid, acetic acid and water, and out-going wirings are formed to complete the semiconductor device 10.

In this embodiment, the description has been based on the case where the electrode 24 for the capacitive element and the resistance element 32 are formed. A fuse element comprising $MoSi_x$ having the same composition as that of the electrode 24 for the capacitive element may be formed in place of the resistance element 32, or the resistance element 32 and the fuse element may be formed simultaneously with the electrode 24 for the capacitive element.

Figure 3:
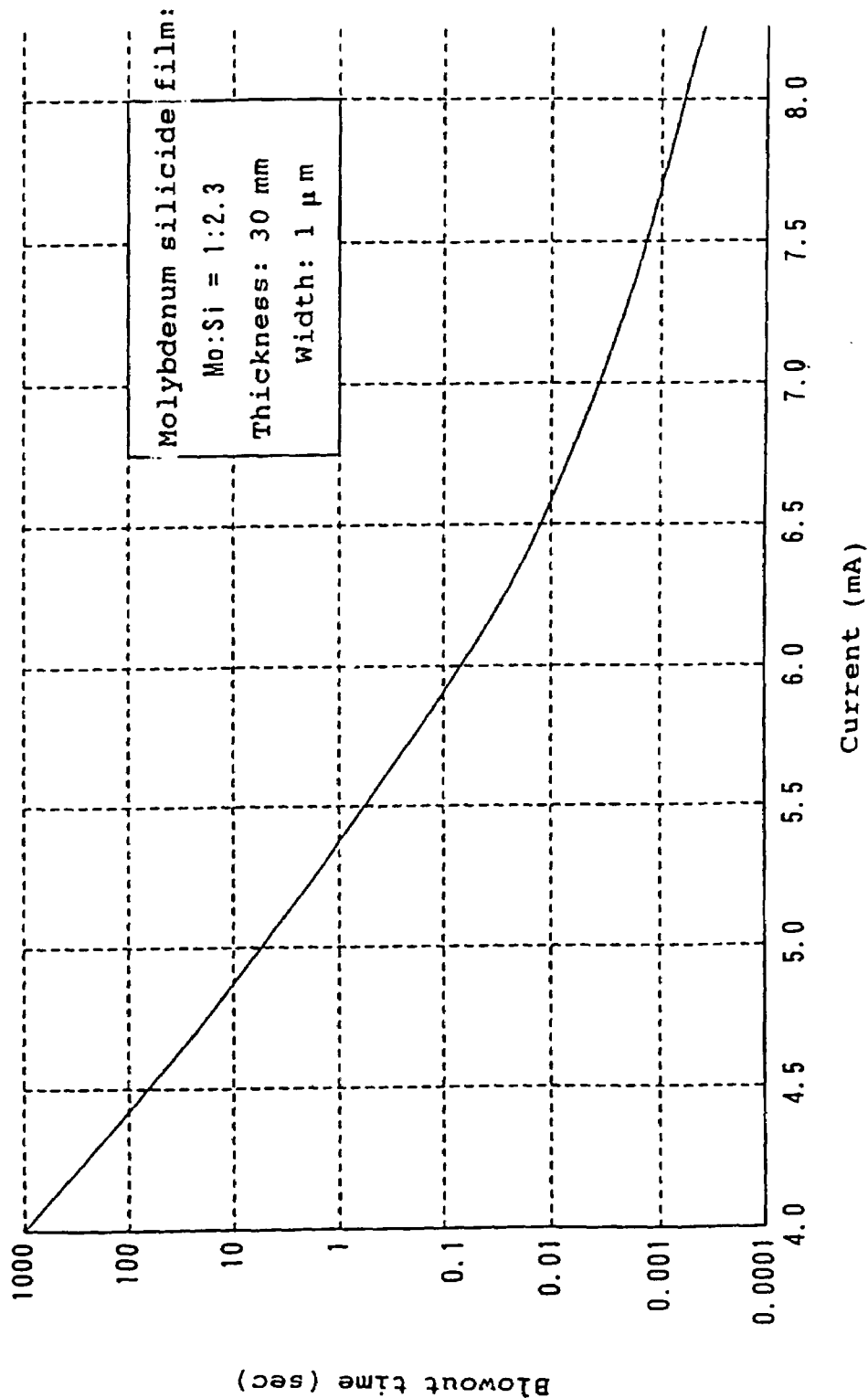
FIG. 3 illustrates the relationship between current flowing through a molybdenum silicide film and the blowout time.

A fuse element comprising $MoSi_x$, having a relatively large specific resistance, can be fused by a small current in a short period of time, thus permitting easy accomplishment of switching of the redundant circuit upon preparing a program, adjustment of voltage of a circuit element, or adjustment of frequency of a clock circuit. More specifically, a molybdenum silicide film having a composition ratio of Mo to Si of 1:2.3, and having a thickness of 30 nm and a width of 1 μm, has a relationship between current fed and the blowout time as shown in FIG. 3, and by flowing a current of about 8 to 10 mA, it is possible to cause blowout within 10 msec.

Figure 4:
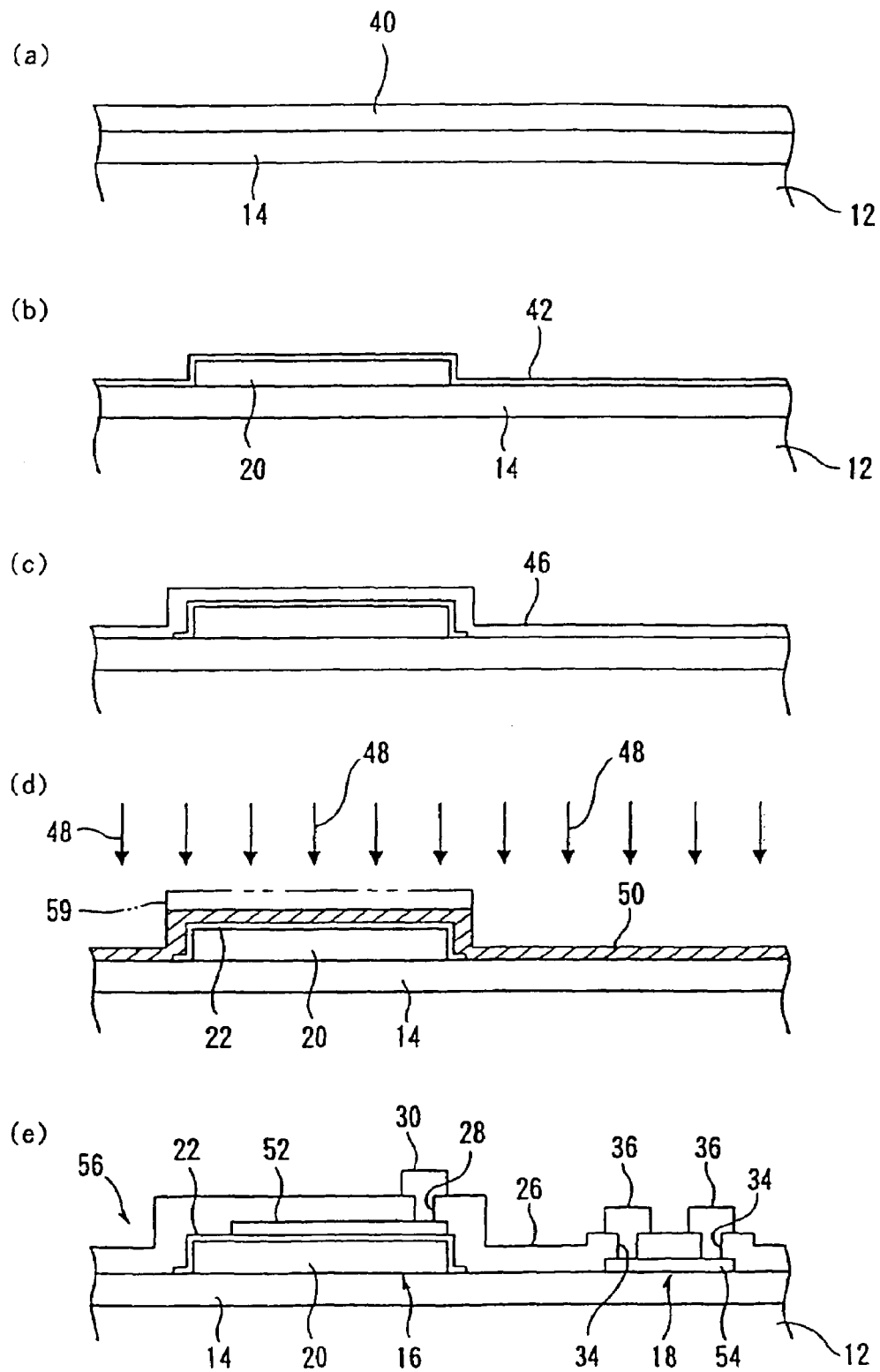
FIG. 4 is a manufacturing process diagram of a semiconductor device according to a third embodiment of the invention.

FIG. 4 is a process diagram of a manufacturing method of a semiconductor device of a third embodiment of the invention.

First, an insulating layer 14 is formed in the same manner as that shown in FIGS. 2(a) and 2(b) above the entire surface of a semiconductor substrate. After forming a gate electrode 20 above the insulating layer 14, a dielectric film 42 is formed (FIGS. 4(a) and (b)). Then, as shown in FIG. 4(c), a dielectric layer 22 is formed so as to cover the gate electrode 20 in the same manner as above, and then a titanium nitride (TiN) film 46 is formed above the entire surface of the semiconductor substrate 12. This TiN film 46 is formed, for example, by mixing nitrogen gas which is an active gas in a flow rate ratio of 60% into argon gas, and applying reactive sputtering with titanium (Ti) at 180° C. and $6 \times 10^{-3}$ Torr, into a thickness of from 5 to 100 nm.

Then, as shown in FIG. 4(d), the semiconductor substrate 12 having the TiN film 46 formed thereon is arranged in a vacuum of about $1 \times 10^{-5}$ to $5 \times 10^{-4}$ Torr, and oxygen ion beam 48 having an acceleration energy of 30 keV is irradiated onto the TiN film 46 to inject about $1 \times 10^{-5}$ to $1 \times 10^{16}$ cm$^2$ oxygen ions, thereby forming a titanium nitride film containing oxygen atoms. Subsequently, treatments as shown in FIG. 2(d) and (e) are applied, thus competing the semiconductor device 56 having the electrode 52 for the capacitive element and the resistance element 54 comprising a film of titanium nitride containing oxygen 50 (FIG. 4(e)).

Figure 5:
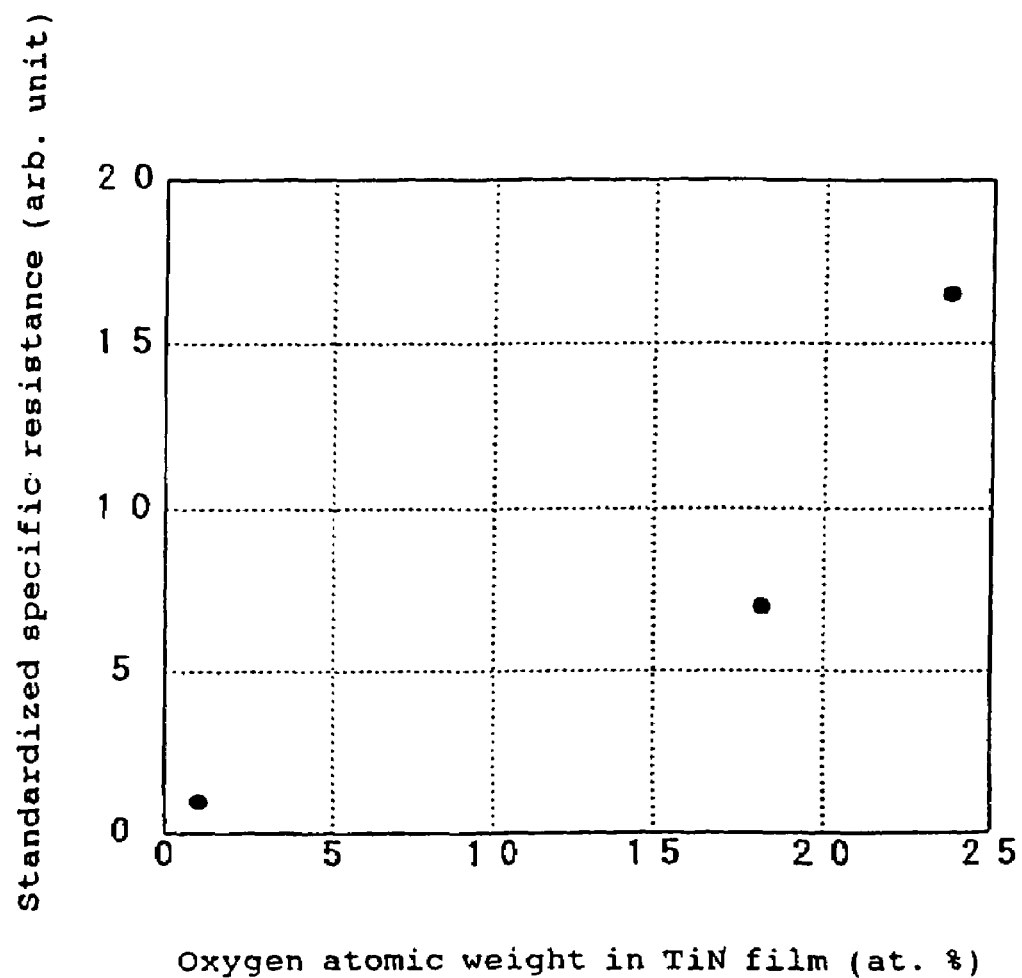
FIG. 5 illustrates the relationship between the weight of oxygen atoms in the TiN film and specific resistance of the TiN film.

The semiconductor device 56 having the electrode 52 for the capacitive element comprising titanium nitride containing oxygen atoms formed as described above can bring about the same advantages as above. Because the resistance element 54 is made of titanium nitride containing oxygen atoms, it is possible to easily change specific resistance and sheet resistivity by acting on the quantity of injected oxygen ions, form a resistance element having a prescribed resistance value in a desired pattern size, and downsize the resistance element. More specifically, as shown in FIG. 5, injection of oxygen atoms into the TiN film largely improves specific resistance, and makes possible the easy formation of a resistance element having a large sheet resistivity. FIG. 5 illustrates the relationship between the quantity of oxygen atoms in the titanium nitride film and specific resistance of the titanium nitride film: the abscissa expresses the quantity of oxygen atoms in the titanium nitride film in atomic %; and the ordinate represents specific resistance of the titanium nitride film, standardization being made with specific resistance of the TiN film not containing oxygen atoms as 1.

In the third embodiment, the semiconductor device may also have a fuse element comprising titanium nitride containing oxygen atoms in place of the resistance element 54, or the resistance element and the fuse element may be formed simultaneously with the electrode 52 for the capacitive element in the same step. In this embodiment, the case where, after forming the TiN film, the film of titanium nitride containing oxygen atoms 50 is formed by ion injection has been described. The film of titanium nitride containing oxygen atoms 50 may also be formed by oxidizing the TiN film 46, conducting sputtering with Ti as a target in an atmosphere comprising oxygen gas and nitrogen gas, or applying annealing, after forming the Ti film by sputtering or the like, in an atmosphere comprising oxygen gas and nitrogen gas.

When oxidizing the TiN film 46 into the titanium nitride containing oxygen atoms film 50, it suffices to apply an oxidation treatment in an oxygen gas atmosphere at 400 to 700° C. for 15 to 45 minutes. When forming the film 50 of titanium nitride containing oxygen atoms by active sputtering, it can be accomplished by mixing oxygen gas in a flow rate ratio of about 5% into nitrogen gas, and conducting sputtering under the same conditions as those for forming the TiN film 46 as described above as to the third embodiment. When the TiN film is annealed to form the film of titanium nitride containing oxygen atoms 50, it suffices to apply a treatment in an atmosphere comprising nitrogen gas in 97% and oxygen gas in 3%, in flow rate ratio, and at a temperature of 400 to 700° C.

As shown in FIG. 4(d), by forming the TiN film 46, masking the portion for forming the capacitive element with a photoresist film 59 or the like, and then injecting oxygen ions into the TiN film 50 or subjecting the TiN film 50 to a thermal oxidation, it is possible to form the electrode 52 for the capacitive element from the TiN film 46 not containing oxygen atoms, and thus to form the electrode for the capacitive element having a low resistance. In addition, because the resistance element 54 is formed from titanium nitride containing oxygen atoms having a large specific resistance, properties of the resultant semiconductor device 56 can further be improved.

Figure 6:
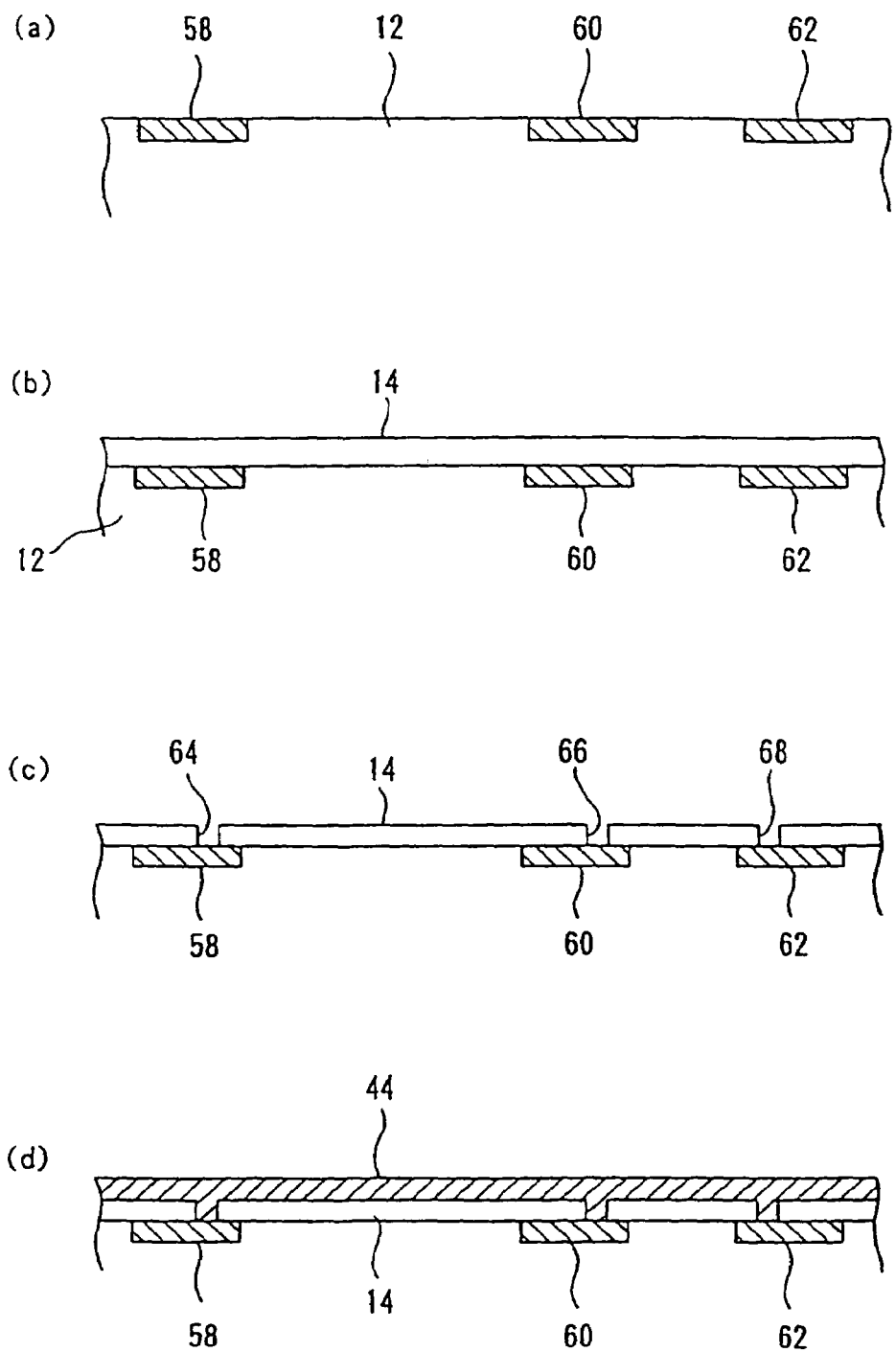
FIG. 6 is a partial process diagram illustrating a manufacturing method of a semiconductor device according to a fourth embodiment of the invention.
Figure 7:
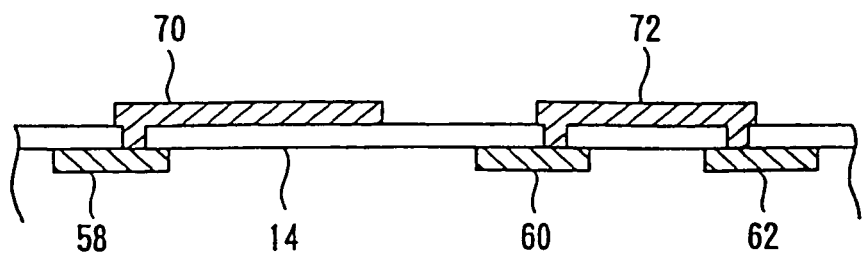
FIG. 7 a partial process diagram of a manufacturing method of a semiconductor device of a fourth embodiment of the invention, describing the steps following the steps illustrated in FIG. 6.
Figure 7:
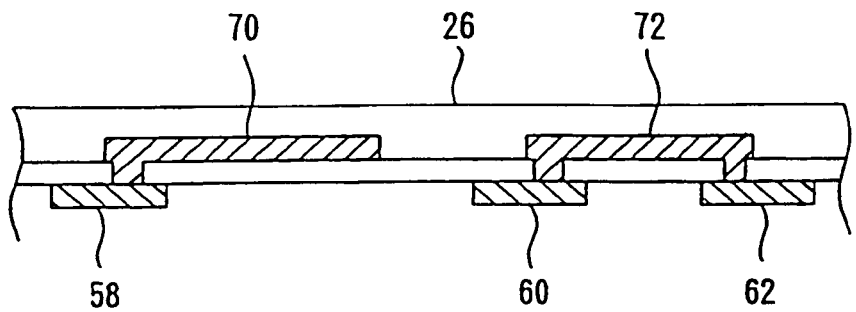
Figure 7:
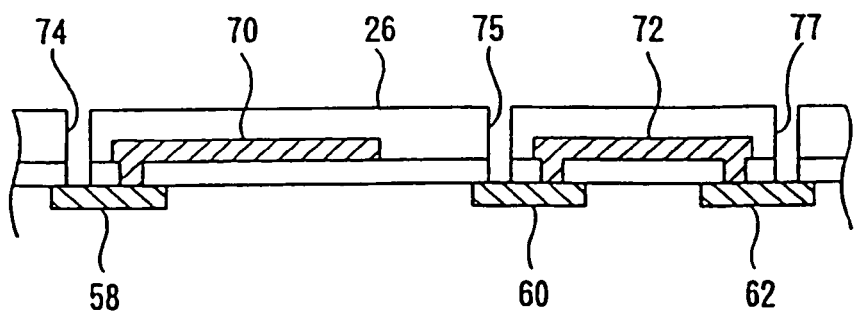
Figure 7:
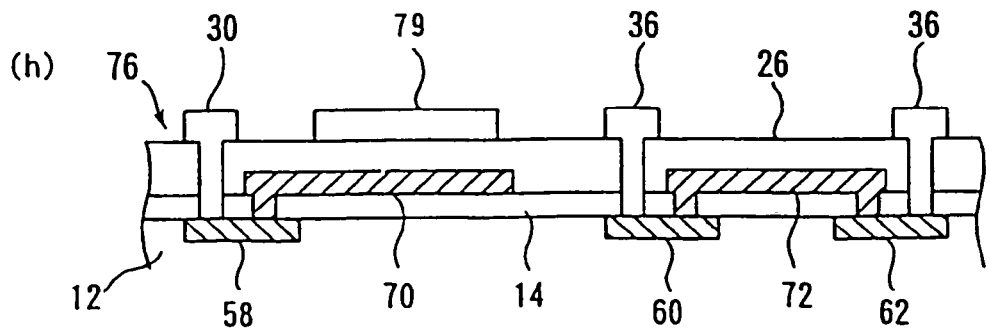

FIGS. 6 and 7 are process diagrams of a manufacturing method of a semiconductor device of a fourth embodiment. In this embodiment, first as shown in FIG. 6(a), ions of V-family elements such as phosphorus (P) and arsenic (As) and ions of III-family elements such as boron (B) are injected in a prescribed amount to a prescribed position of the semiconductor substrate 12 comprising silicon to form a plurality of diffusion layers 58, 60 and 62 comprising n-type and p-type conductive layers in the capacitive element forming region and the resistance element forming region. Subsequently, as shown in FIG. 6(b), and insulating layer 14 comprising a silicon oxide film or the like is deposited into a prescribed thickness (for example, 400 nm) on the upper surface of a semiconductor substrate 12. Then, as shown in FIG. 6(c), first through-holes 64, 66 and 68 are formed by etching in the insulating layer 16 above the diffusion layers 58, 60 and 62. Then, MoSi$_x$ is deposited into thickness of 5 to 100 nm by sputtering so as to cover the entire surface of the insulating layer to form an MoSi$_x$ film 44 (FIG. 6(d)).

Then, as shown in FIG. 7(e), an electrode 70 for a capacitive electrode, comprising MoSi$_x$, electrically connected to the diffusion layer 58, and a resistance element 72, comprising MoSi$_x$, electrically connected to the diffusion layers 60 and 62, are formed in the same manner as above. Then, an insulating film 26 comprising a silicon oxide film, a silicon nitride film, or a tantalum oxide film is formed into a prescribed thickness so as to cover the entire upper portion of semiconductor substrate 12 (FIG. 7(f)). This insulating film 26 also forms a dielectric layer of the capacitive element. Then, second through-holes 74, 75 and 77 passing through the insulating layer 14 and the insulating film 26 are formed above the diffusion layers 58, 60 and 62 (FIG. 7(g)). Then, a metallic film comprising Al or an Al—Cu, an Al—Si—Cu, or a combination of a barrier metal such as TiN or TiN with Al or an aluminum alloy is formed so as to cover the surface of the insulating film 26. An opposite electrode 79 for the capacitive element opposing to the electrode 70 for the capacitive element is formed in the same manner as above. At the same time, out-going electrodes 30, 36 and 36 electrically connected to the diffusion layers 58, 60 and 62 are formed, thereby completing the semiconductor device 76 having the electrode 70 for the capacitive element, comprising MoSi$_x$ and the resistance element 72.

The semiconductor device 76 of this embodiment formed as described above, in which the insulating film 26 is a dielectric layer, permits simplification of the process. In this embodiment also, a fuse element may be formed in place of the resistance element 72, and the resistance element or the fuse element may formed from titanium nitride containing oxygen atoms in place of MoSi$_x$. In addition, the opposite electrode 79 may be a gate electrode.

Figure 8:
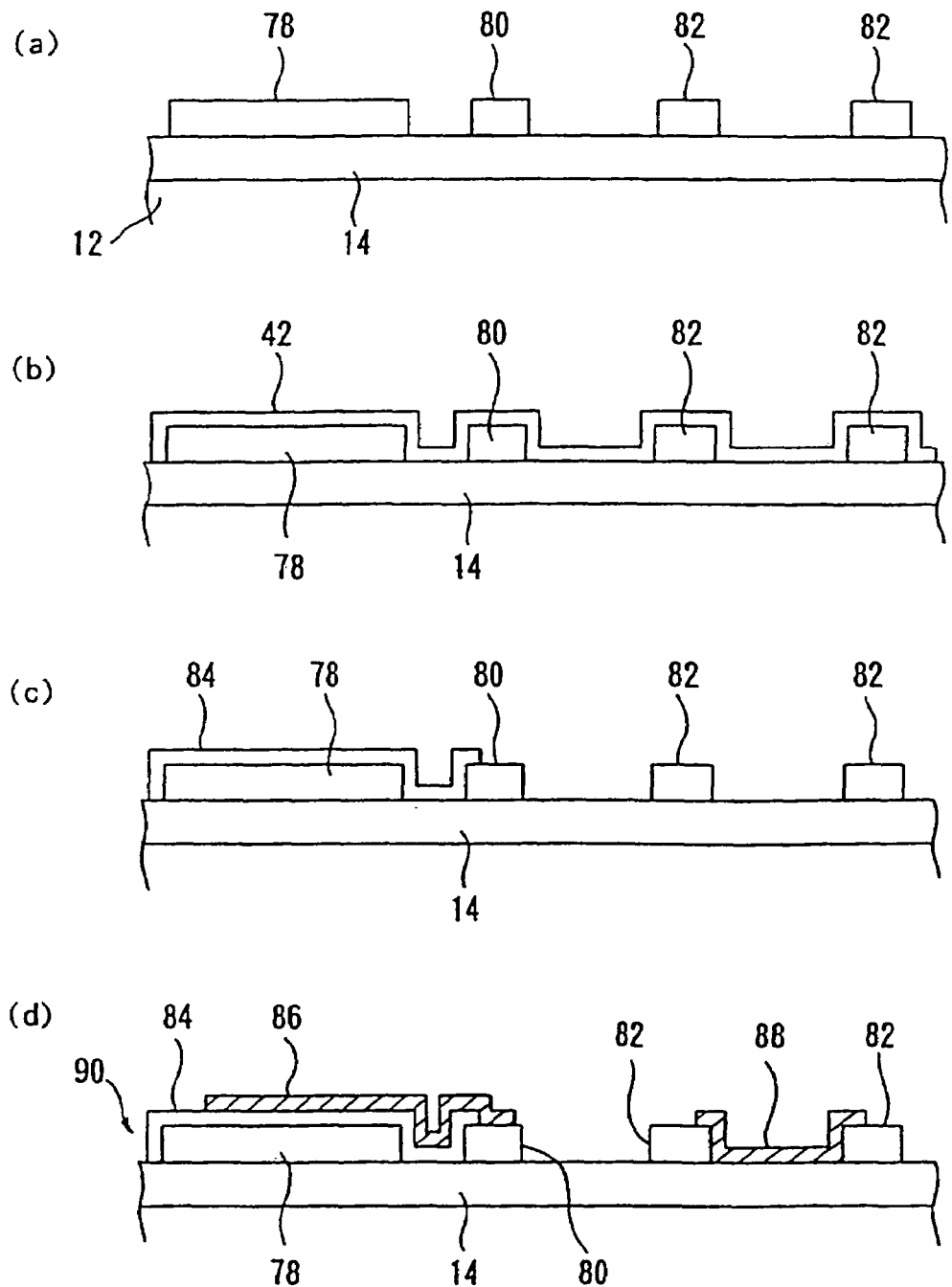
FIG. 8 is a process diagram illustrating a manufacturing method of a semiconductor device according to a fifth embodiment of the invention.

FIG. 8 is a process diagram of a manufacturing method of a semiconductor device of a fifth embodiment. In this embodiment, as shown in FIG. 8(a), an insulating layer 14 is formed so as to cover the upper surface of a semiconductor substrate 12 in the same manner as above. Then, Al or Al—Cu or Al—Si—Cu, or a combination of a barrier metal such as TiN or TiW with Al or an aluminum alloy is deposited into a thickness of about 100 nm over the surface of the insulating layer 14. By etching the same, an opposite electrode 78 for capacitive element comprising an undercoat wiring, an out-going electrode 80 for capacitive element, and an out-going electrode 82 for resistance element are formed. Then, after forming a dielectric film 42 so as to cover these electrodes and the insulating layer 14 (FIG. 8(b)), a photoresist film is formed in a dielectric layer forming region. The dielectric film 42 at portions other than the dielectric layer forming region may be removed by dry etching, and a dielectric layer 84 is formed so as to extend over the opposite electrode 78 and the out-going electrode 80 for the capacitive element. Subsequently, an MoSi$_x$ film is deposited above the entire semiconductor substrate 12, and as shown in FIG. 8(d), an electrode 86 for the capacitive element comprising MoSi$_x$ is formed by etching above the dielectric layer 84, thereby completing a semiconductor device 90 by forming a resistance element 88 between the out-going electrodes 82 and 82 for resistance element. In this embodiment also, a fuse element may be formed in place of the resistance element 88.

Figure 9:
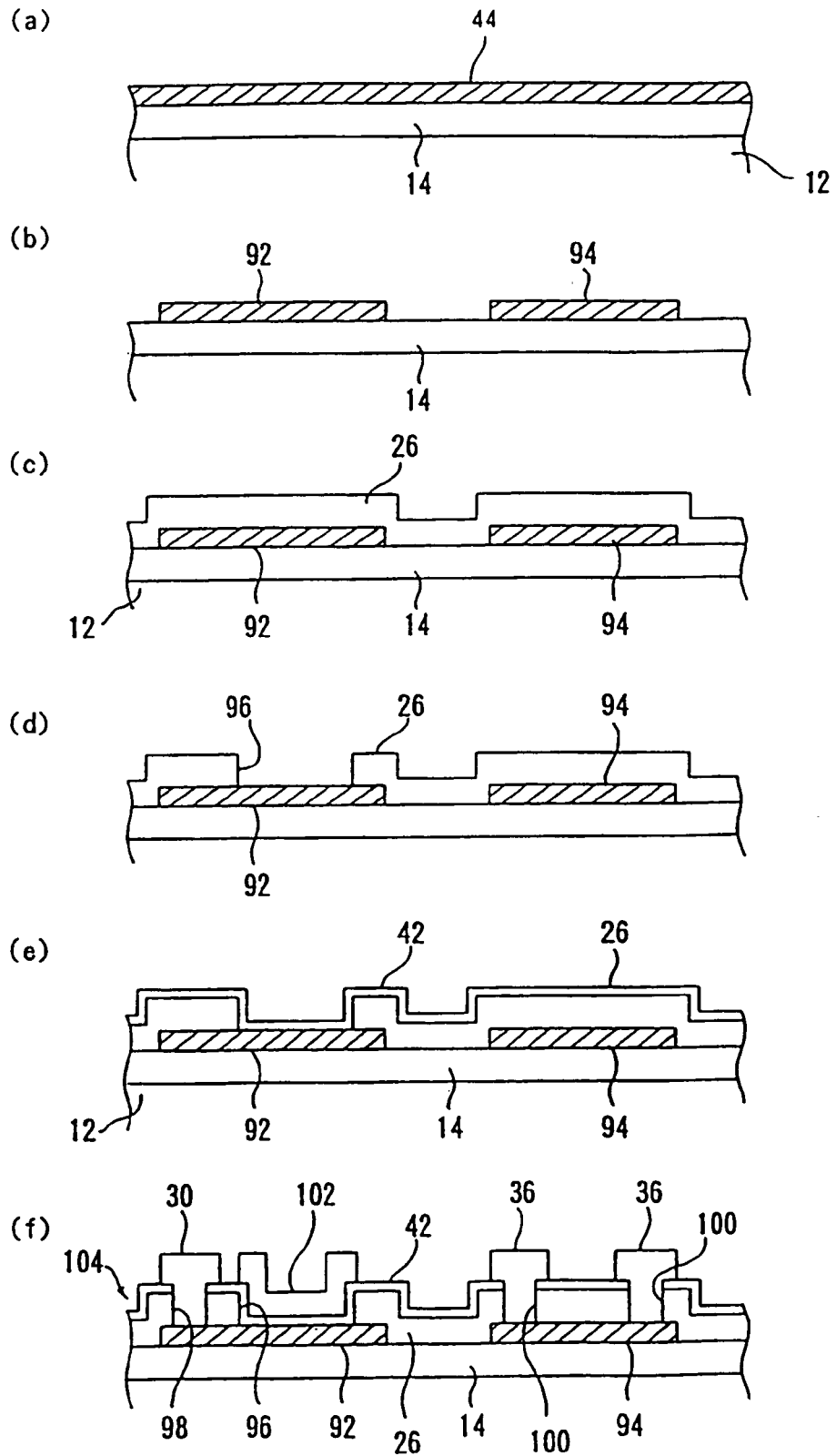
FIG. 9 is a process diagram illustrating a manufacturing method of a semiconductor device according to a sixth embodiment of the invention.

FIG. 9 is a process diagram of a manufacturing method of a semiconductor device of a sixth embodiment of the invention. In this embodiment, an insulating layer 14 is formed on the upper surface of a semiconductor substrate 12 in the same manner as above, and then, an MoSi$_x$ film 44 is formed so as to cover the entire upper surface of the insulating layer 14 (FIG. 9(a)). Then, as shown in FIG. 9(b), an electrode 92 for a capacitive element comprising MoSi$_x$ is formed in a capacitive element forming region by etching, and a resistance element 94 is formed in a resistance element forming region. Subsequently, as shown in FIG. 9(c), an insulating film 28 is deposited above the entire surface of the semiconductor substrate 12, and then a through-hole 96 is formed in the insulating film 26 above the electrode 92 for capacitive element (FIG. 9(d)). This through-hole 96 has a size determined in response to the electrostatic capacity of the capacitive element.

Then, as shown in FIG. 9(e), a dielectric film 42 is formed above the entire upper surface of the semiconductor substrate 12. Through-holes 98 and 100 passing through the insulating film 26 and the dielectric film 42 above the electrode 92 for the capacitive element and the resistance element 94 may be formed by etching (FIG. 9(f)). Then, a metallic film comprising Al, Al—Cu, Al—Si—Cu, or a combination of a barrier metal such as TiN or TiW with Al or an aluminum alloy, is formed so as to cover the entire dielectric film 42. An electrode 102 for the capacitive element is formed at a position corresponding to the through-hole 96 by etching the same. At the same time, an out-going electrode 30 for the capacitive element, connected to the electrode 92 for the capacitive element and an out-going electrode 36 for resistance element, connected to the resistance element 94 are formed to complete a semiconductor device 104.

With the semiconductor device 104 thus formed, in which the dielectric film 42 is formed separately from the insulating film 26, it is possible to form the dielectric film 42 having a thickness sufficient for the electrostatic capacity of the capacitive element, easily perform adjustment of the electrostatic capacity, and downsize the capacitive element.

Figure 10:
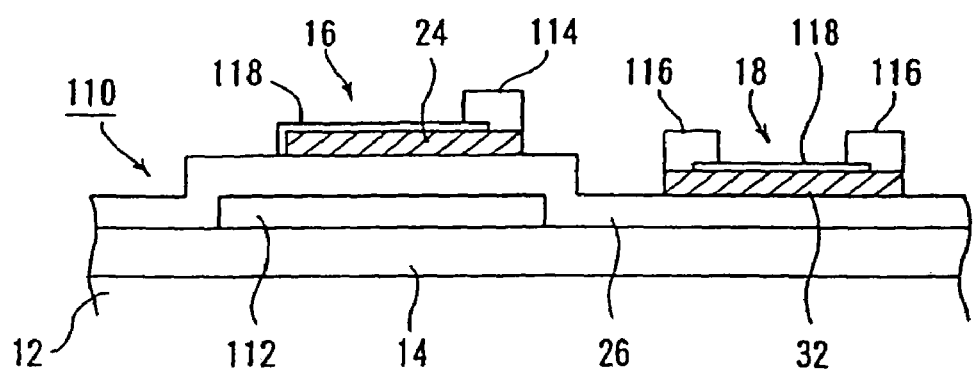
FIG. 10 is a partial description view of a semiconductor device according to a seventh embodiment of the invention.

FIG. 10 is a partial descriptive view of a semiconductor device of a seventh embodiment of the invention. In a semiconductor device 110, a gate electrode (or an undercoat wiring) 112 serving as an opposite electrode for a capacitive element forming a capacitive element 16 is formed above an insulating layer 14 so as to cover a semiconductor substrate 12. Further, an insulating film 26 is provided so as to cover the gate electrode 112 and the insulating layer 14. For the insulating film 26, a portion above the gate electrode 112 serves as dielectric layer for storing electric charge of the capacitive element 16, and an electrode 24 for capacitive element comprising MoSi$_x$ is formed above the insulating film 26 opposing to the gate electrode 112.

In a resistance element forming region, on the other hand, a resistance element 32 serving as a resistance element 18 is formed above the insulating film 26. Out-going electrodes 114 and 116 comprising metallic films of Al, Al—Cu, Al—Si—Cu, or a combination of a barrier metal such as TiN or TiW with Al or an aluminum alloy, electrically connected to the electrode 24 for capacitive element and the resistance element 32, are formed thereabove. An insulating film 118 is provided on the upper surfaces of the electrode 24 for the capacitive element and the resistance element 32. This insulating film 118 is for preventing the electrode 24 for the capacitive element or the resistance element 32 from being damaged upon processing the out-going electrodes 114 and 116 by etching. It may therefore be provided as required, or may be omitted.

Figure 11:
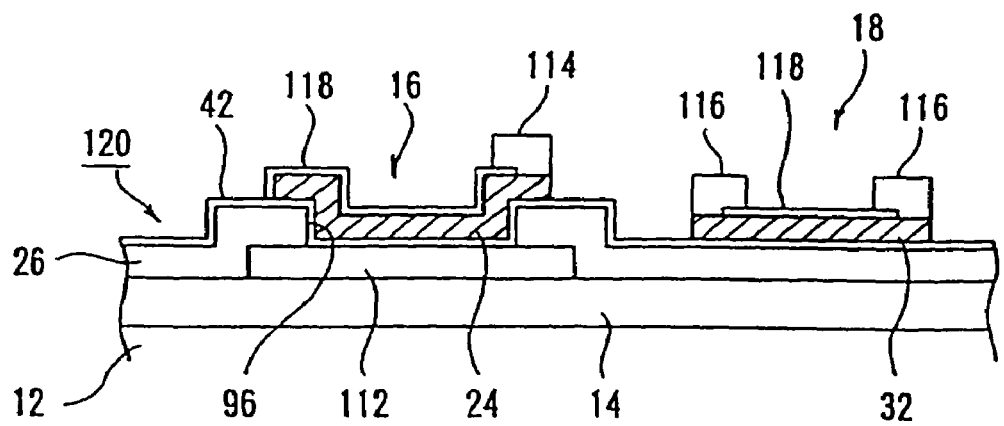
FIG. 11 is a partial descriptive view of a semiconductor device according to an eighth embodiment of the invention.

FIG. 11 is a partial descriptive view of a semiconductor device of an eighth embodiment of the invention. In this semiconductor device 120 of the eighth embodiment, which is a variant of the semiconductor device 110 of the seventh embodiment, after forming an insulating film 26, a through-hole 96 is formed by removing the insulating film 26 above a gate electrode 112. Then, after forming a dielectric film 42 above the entire upper surface of a semiconductor substrate 12, an electrode 24 for the capacitive element comprising MoSi$_x$ is formed above the dielectric film 42 at a portion corresponding to the through-hole 96, and a resistance element 32 is formed in a resistance element forming region.

Figure 12:
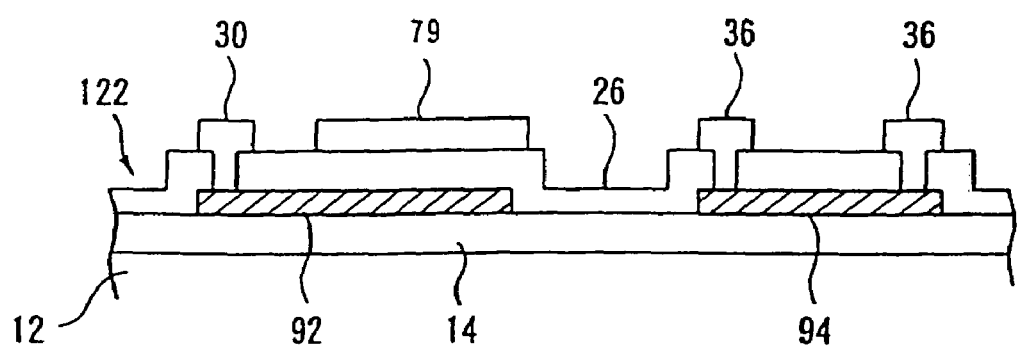
FIG. 12 is a partial descriptive view of a semiconductor device according to a ninth embodiment of the invention.

FIG. 12 is a partial description view of a semiconductor device of a ninth embodiment. In the semiconductor device 122 of this embodiment, an electrode 92 for a capacitive element and a resistance element 94 comprising MoSi$_x$ are formed directly on an insulating layer 14. An insulating film 26 provided so as to cover a semiconductor substrate 12 is located above the electrode 92 for the capacitive element and the resistance element 94, and an electrode 79 for the capacitive element and out-going electrodes 30 and 36 are formed there above.

Figure 13:
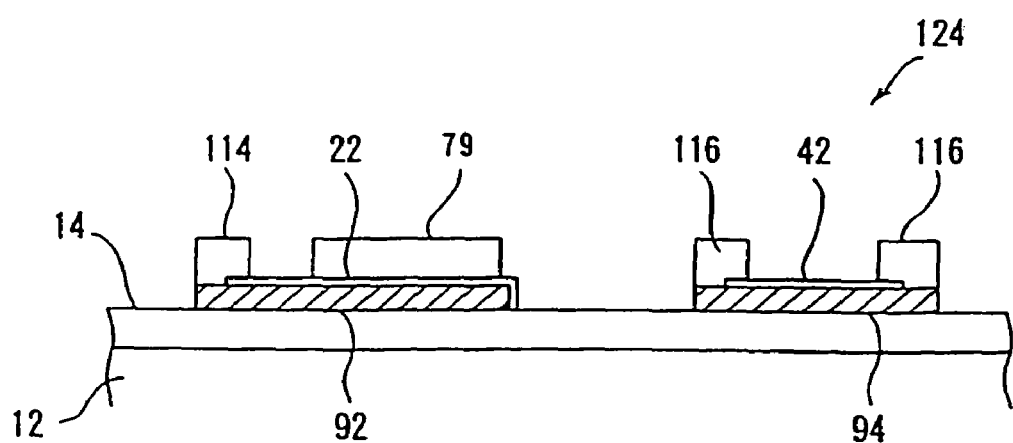
FIG. 13 is a partial descriptive view of a semiconductor device according to a tenth embodiment of the invention.

FIG. 13 is a partial descriptive view of a tenth embodiment of the invention. In a semiconductor device 124 of this embodiment, an electrode 92 for a capacitive element and a resistance element 94 comprising MoSi$_x$ are provided on an insulating layer 14 in contact therewith. After forming the electrode 92 for the capacitive element and the resistance element 94, a dielectric film 42 above the entire upper surface of the semiconductor substrate 12. A dielectric layer 22 comprising the dielectric film 42 is formed above the electrode 92 for the capacitive element by etching the dielectric film 42, and the dielectric film 42 above the resistance element 94 may be left as an insulating film for preventing damage.

In the seventh to tenth embodiments also, the electrode for the capacitive element and the resistance element may be formed simultaneously in the same step. In these embodiments as well, titanium nitride containing oxygen atoms may be used in place of $MoSi_x$, and a fuse element may be formed in place of the resistance element. The resistance element and the capacitive electrode may be formed simultaneously upon forming the electrode for capacitive element.

According to embodiments of the present invention, as described above, it is possible to reduce the parasitic capacity of the electrode of the capacitive element, thus permitting high-speed operation of a large scale integrated circuit. By forming simultaneously the electrode for the capacitive element and the resistance element or the fuse element, it is possible to simplify the manufacturing process and reduce the cost.

It will, of course, be understood that modifications of the present invention, in its various aspects, will be apparent to those skilled in the art. Other embodiments for semiconductor devices and manufacturing methods are possible, their specific features depending upon the particular application. Therefore, the scope of the invention should not be limited by the particular embodiments herein described but should be defined by the appended claims and equivalents thereof.

What is claimed:

1. A method of manufacturing a semiconductor device comprising:
   forming an insulating layer above a semiconductor substrate;
   forming a conducting region above the insulating layer, the conducting region selected from the group consisting of a gate electrode and an undercoat wiring;
   forming a dielectric layer above the conducting region;
   forming a film comprising a titanium nitride layer containing oxygen atoms within a range of from 5 to 25 atomic %;
   forming an electrode for a capacitive element above the dielectric layer by processing the film;
   forming an out-going electrode connected to the electrode for the capacitive element; and
   forming at least one of a resistance element and a fuse element, wherein the electrode for the capacitive element has the same composition as that of the at least one of a resistance element and a fuse element.

2. A method of manufacturing a semiconductor device comprising:
   forming an insulating layer above a semiconductor substrate;
   forming a conducting region above the insulating layer, the conducting region selected from the group consisting of a gate electrode and an undercoat wiring;
   forming a dielectric layer above the conducting region;
   forming a film comprising a titanium nitride layer containing oxygen atoms within a range of from 5 to 25 atomic %;
   forming an electrode for a capacitive element above the dielectric layer by processing the film;
   forming an out-going electrode connected to the electrode for the capacitive element; and
   forming the electrode for the capacitive element simultaneously with the one of a resistance element and a fuse element.

* * * * *